United States Patent [19]
Kawaguchi

[11] Patent Number: 5,793,052
[45] Date of Patent: Aug. 11, 1998

[54] DUAL STAGE FOLLOWING METHOD AND APPARATUS

[75] Inventor: Ryoichi Kawaguchi, Tokyo, Japan

[73] Assignee: Nikon Corporation, Japan

[21] Appl. No.: 819,951

[22] Filed: Mar. 18, 1997

[51] Int. Cl.[6] ........................................... G01N 21/86
[52] U.S. Cl. ........................ 250/559.3; 250/548; 356/401
[58] Field of Search ........................... 250/559.3, 559.39, 250/548, 216; 356/399–401; 355/53, 55

[56] References Cited

U.S. PATENT DOCUMENTS

| | | | |
|---|---|---|---|
| 4,871,896 | 10/1989 | Kempter et al. | 219/121.6 |
| 5,255,051 | 10/1993 | Allen | 355/77 |
| 5,633,720 | 5/1997 | Takahashi | 250/548 |

*Primary Examiner*—Que Le
*Attorney, Agent, or Firm*—Skjerven, Morrill, MacPherson, Franklin & Friel LLP; Norman R. Klivans

[57] ABSTRACT

A method and apparatus minimizes the relative difference between motions of two stages driven by a single input signal, where the motions of the two stages ideally are perfectly synchronized. In practice, synchronization is imperfect due to mechanical/environmental disturbances in each stage as well as electrical differences affecting the stage controller. The two stages are serially coupled for control purposes so that a signal indicating the position of the first stage is used as an input driving signal to the second stage. The relative location error between the two stages is thereby minimized, compared to the case where the two stages are driven simultaneously but in parallel by a common input signal. Furthermore, by using the lower bandwidth stage as the driver (first) stage and the higher bandwidth stage as the follower (second) stage, the relative position error is no larger than the smaller of the absolute position errors of either stage alone. One exemplary application is improved alignment of a reticle stage and a wafer stage in a scanning exposure system for semiconductor lithography.

9 Claims, 7 Drawing Sheets

| Control bandwidth | Synchronization error | |
|---|---|---|
| Wafer = Reticle | W → R  is same as  R → W | |
| Wafer > Reticle | W → R  is better than  R → W | |
| Reticle > Wafer | R → W  is better than  W → R | |

FIG. 7

DUAL STAGE FOLLOWING METHOD AND APPARATUS

FIELD OF THE INVENTION

This invention relates to a stage following method for precision apparatuses such as alignment of reticle and wafer stages in a scanning exposure device for semiconductor lithography. More particularly, this invention relates to minimizing relative position error between two stages driven by a single input signal.

BACKGROUND OF THE INVENTION

In semiconductor lithography, a reticle is imaged through a reduction-projection lens onto a wafer below. A scanning exposure device uses simultaneous motion of the reticle and wafer (each mounted on its own X-Y stage) to continuously project a portion of the reticle onto the wafer through a projection optics. Scanning, as opposed to exposure of the entire reticle at once, allows for the projection of reticle patterns that exceed in size that of the image field of the projection lens.

A typical arrangement for simultaneously driving two such stages is shown in FIG. 1. The input (control) signal x0 is used to drive the two stages (plants) 10, 14 in parallel, producing outputs y1 and y2, respectively. ("Plant" is a well-known term of art referring to a mechanical assembly such as a stage.) In the ideal case, y1 and y2 should be equal to each other and to x0, the control signal.

FIG. 2a shows a first (e.g. reticle) stage 10 with associated interferometer mirror 18, voice coil motor 20, linear motor 22, and second linear motor 24. Also shown are the associated mechanical/environmental disturbances. FIG. 2b shows a second e.g. (wafer) stage 14 associated with reticle stage 10, and having associated interferometer mirror 30, four linear motors 32, 34, 36, 38, and AF/AL mechanics 42. AF/AL refers to "auto focus and auto leveling" conventionally used for focusing and wafer inclination by moving the wafer stage 14. Also shown are the associated mechanical/environmental disturbances. FIG. 2c shows the controller 48 and host computer 50 for controlling reticle and wafer stages 10, 14, with the associated electrical/electronic disturbances.

Thus in practice, mechanical/environmental disturbances as shown in FIGS. 2a and 2b and electrical disturbances as shown in FIG. 2c cause each stage 10, 14 to experience an absolute position error respectively e1, e2 given by:

$$e1=x0-y1$$

and $$e2=x0-y2$$

(x0, y1, y2, e1, and e2 are all position signals).
The relative position error between the two stages 10, 14 is thus $$e=y1-y2$$

or $$e=e1-e2.$$

In the worst case, $$e1=-e2$$

and the relative position error is $$e=2*e2,$$

the sum of the absolute position errors of each stage (plant) alone.

FIG. 2d shows a conventional scanning exposure device for photolithography. Certain of the elements in FIG. 2d similar to elements described above have similar reference numbers. Reticle stage 10 supports reticle 14. A long "bar" mirror 18a and two smaller mirrors 18b, 18c are mounted along the sides of reticle stage 10. Interferometer heads 20a, 20b and 20c respectively direct laser beams 23 (herein designated $X_r$, $Y_{r1}$ and $Y_{r2}$) onto the associated mirrors and detect the beam reflection therefrom, for position measuring purposes. A light beam 22 is directed from a conventional source (not shown) through the reticle 14 through conventional projection lens 30 onto a wafer 34, which is held on a wafer chuck 42 which is mounted on the wafer stage 14. The wafer stage 14 rides on a flat base 32. Mounted on the wafer stage 14 are two bar mirrors 30a and 30b. Laser beams $X_{w2}$, $X_{w1}$, $Y_{w2}$, and $Y_{w1}$ are directed from laser interferometer heads 36a, 36b, 36c and 36d onto the mirrors 30a, 30b to measure the actual position of the wafer stage 14.

Some prior art stages utilize a Fine Motion Mechanism (FMM), also referred to as a fine stage, in conjunction with one of the primary stages to further reduce the relative position error between the two above-described stages 10, 14 of FIGS. 2a, 2b, 2d. The relative position error between the two primary stages 10, 14 is used as the input position signal for the FMM. FIG. 3 shows a FMM schematically as Plant3 56. The absolute position errors including e3 for the FMM 56 are now given by:

$$e1=x0-y1,$$

$$e2=x0-y2,$$

and $$e3=(y1-y2)-y3,$$

where $$e3<<e1, e2.$$

Thus, the relative position error between the first stage 10 (Plant1) and the second stage (Plant2 14 and Plant3 56), $$e=y1-(y2+y3)=e3$$

is bounded by the absolute position error of the FMM 56 and is greatly reduced from the relative error in FIG. 1. However, in order to be capable of much greater precision than either of the primary stages, the FMM 56 is added onto the primary stage 14. This requires room on the primary stage 14 for the actuator and sensor of the FMM, which makes the total system much more complicated mechanically and therefore undesirably more expensive and less reliable.

Therefore it would be desirable to have a two stage system without the complication of the third fine motion mechanism, but with equal or greater performance (precision).

SUMMARY

In accordance with this invention, the relative position error between two stages which, when driven simultaneously by a single input signal, should move in perfect synchronization, is minimized. In practice, as described above, there is some deviation between the two outputs (positions) because of mechanical/environmental and/or electrical/electronic disturbances affecting the two stages.

In accordance with the present invention, the two stages are serially coupled for control purposes, such that the output position signal of the first stage is used as the input position signal to the second stage. This generally reduces the relative position error between the two stages compared to the above-described prior art method of driving the stages in parallel, and without the FMM's mechanical complexity.

Furthermore by serially ordering the stages such that the lower bandwidth stage is the driver (first stage) and the higher bandwidth stage is the follower (second stage), the relative position error is guaranteed to be no larger than the smaller of the absolute position errors of either stage alone.

One exemplary application is improved position synchronization of simultaneously driven reticle and wafer stages in a scanning exposure device for semiconductor lithography. However, this invention is not limited to semiconductor lithography but is applicable to high precision stage synchronization applications generally including other scanning exposure devices. For example, in laser printing, a paper advancement stage (vertical motion along the length of the paper) and an exposure stage (scanning across the width of the paper) must be synchronized (after appropriate scaling factors to account for the different dimensions) with minimum relative position error.

BRIEF DESCRIPTION OF THE DRAWINGS

FIG. 7 shows a wafer stage-reticle stage control method.

DETAILED DESCRIPTION

Figure 4:
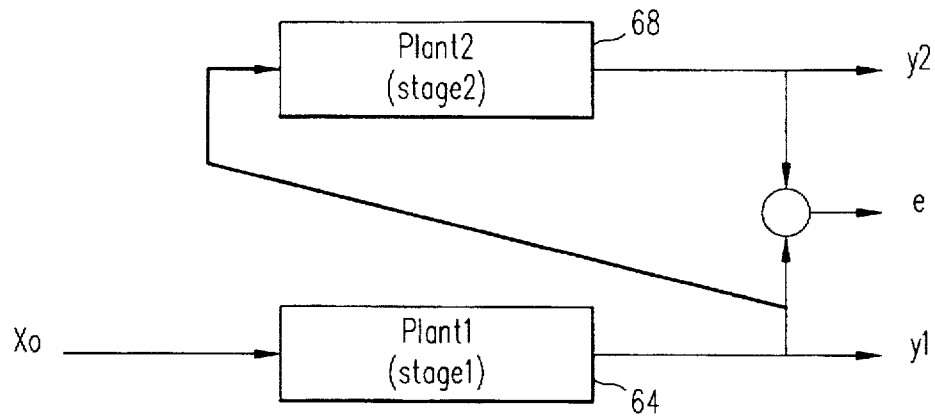
FIG. 4 shows in accordance with this invention a serial coupling of two stages.

In accordance with this invention, FIG. 4 shows two stages 64, 68 coupled serially, such that the first stage 64 is driven by the input positioning (control) signal x0, and the second stage 68 is driven by the output signal y1 indicating a position of the first stage. The absolute position errors of the two stages 64, 68 are:

$e1=x0-y1$ (for stage 1)

and $e2=y1-y2$ (for stage 2).

Thus the relative position error between the two stages 64, 68 is:

$e=y1-y2=e2$, which is bounded by the absolute position error of the second stage 68. This is a significant improvement over the above-described prior art parallel coupling where the relative error can be as large as the sum of the absolute position errors of the two stages independently.

When two stages are thus serially coupled for control purposes, the movement of the second stage 68 is said to follow the movement of the first stage 64. For any given pair of stages, which stage is the driver and which stage is the follower depends on individual characteristics of the stages. In the description that follows, selection of the driver and follower stages is shown in the exemplary context of wafer and reticle stages for a scanning exposure device for semiconductor lithography. However, it is understood that the terms "wafer stage" and "reticle stage" herein are examples of high precision stage pairs generally, and that the selection of driver and follower stages is not limited to the illustrated application.

It is to be understood that the serial connection is for control purposes, and does not require a direct mechanical linkage. With reference to FIG. 4, the position signals y1, y2, are obtained by any one of a variety of well known types of position sensing devices, e.g. an interferometer, a capacitive or magnetic sensor, or a linear encoder. Typically at least one such position sensor is associated with each of stages 64, 68, and outputs electrical signals y1, y2 which respectively indicate a position of each stage 64, 68. Signal y1 is, as shown in FIG. 4, used to control stage2 68 by being coupled to the actuator which controls movement of stage2 68. This actuator is e.g. a linear motor, voice coil motor, stepper motor, screw drive actuator, and is controlled by conventional drive control circuitry. Hence signal y1 is an input signal to this drive control circuitry, which in FIG. 4 is illustrated (for simplicity) as being part of stage2 68.

Figure 5A:
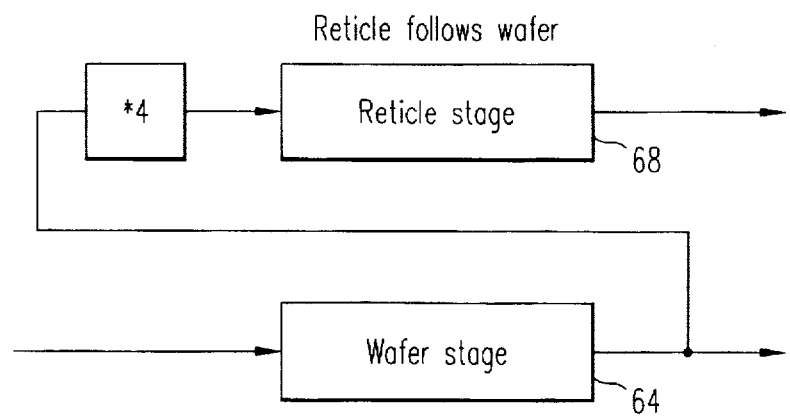
FIG. 5a shows a reticle stage following a wafer stage.
Figure 5B:
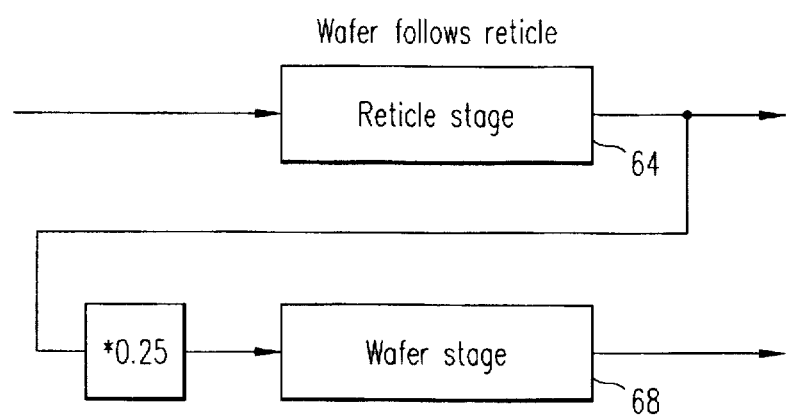
FIG. 5b shows the wafer stage following the reticle stage.

FIGS. 5a and 5b show respectively the two possible wafer-reticle stage serial coupling strategies: in FIG. 5a, reticle stage 68 follows the wafer stage 64; in FIG. 5b, wafer stage 68 follows the reticle stage 64. FIGS. 5a and 5b also illustrate respectively a factor of four multiplication (*4) or division (*0.25) of the driver stage output signal, to account for the fact that movement synchronization requires the larger reticle on its stage to move four times as much as the wafer on its stage. Such a scaling factor is common to high precision stage following applications. For example, in a laser printer where a paper feeding stage must be synchronized with a line exposure stage, a similar scale factor is needed to account for the different horizontal and vertical dimensions of the paper.

Figure 6:
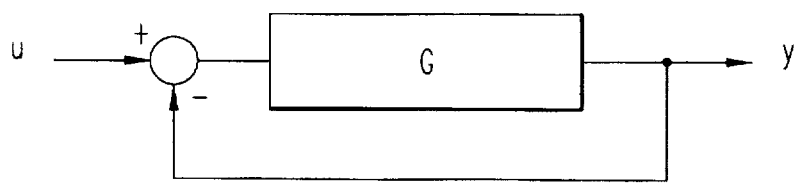
FIG. 6 shows a schematic representation of the controller dynamics of a stage.

FIG. 6 shows a schematic representation of the controller dynamics of both the wafer and reticle stages. For control purposes, each stage may be represented as a transfer function G with a feedback loop such that the output position signal y is related to the input position signal u according to:

$y=G/(1+G)*u$.

Specifically, the position of the reticle stage (r) 64 is described as:

$yr=Gr/(1+Gr)*ur$ and the position of the wafer stage (w) 68 is:

$yw=Gw/(1+Gw)*uw$.

Corresponding to the case of FIG. 5a, the reticle stage following the wafer stage, the input (position) signal to the reticle stage is the output (position) signal from the reticle stage, with an appropriate scale factor M. As shown in FIGS. 5a and 5b, a common choice for semiconductor lithography is M=4; in general, the scale factor is dictated by the needs of the particular application:

$$ur=M*yw.$$

Thus, in wafer coordinates, the wafer stage-reticle stage position error is given by:

$$Ea=yr/M-yw=Gw/(1+Gw)*uw/(1+Gr).$$

Corresponding to the case of FIG. 5b, the wafer stage following the reticle stage, the input (position) signal to the wafer stage is the output (position) signal from the wafer stage, with the appropriate scale factor:

$$uw=yr/M.$$

Thus, in wafer stage coordinates, the wafer stage-reticle stage position error is:

$$Eb=yr/M-yw=Gr/(1+Gr)*ur/(1+Gw).$$

Since the input signals are identical but for a scale factor in either case:

$$uw=ur/M,$$

the ratio of the position errors in these two cases is independent of the scale factor used and is given by $$Ea/Eb=Gw/Gr.$$

Recalling that the case of FIG. 5a is reticle stage following and that of FIG. 5b is wafer stage following, it may be seen that Gw<Gr implies E(reticle stage following)<E (wafer stage following), Gw=Gr implies E(reticle stage following)=E (wafer stage following), and Gr<Gw implies E(wafer stage following)<E (reticle stage following).

This leads to the selection criterion that the stage with the highest bandwidth (highest gain) should follow the stage with the lowest bandwidth (lowest gain) to minimize the relative error. This control method is shown in FIG. 7, where the notation "W→R" means the wafer stage follows the reticle stage, and "R→W" means the reticle stage follows the wafer stage.

Hence the present invention allows use of two synchronized stages, so that position error between them is minimized, without requiring the complexity of a third fine motion stage. This is done by coupling the two stages serially.

Figure 1:
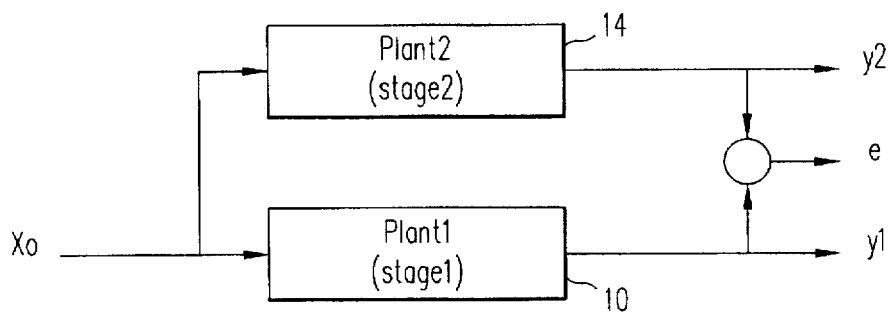
FIG. 1 shows a typical prior art arrangement for simultaneously driving a pair of stages connected in parallel.
Figure 2A:
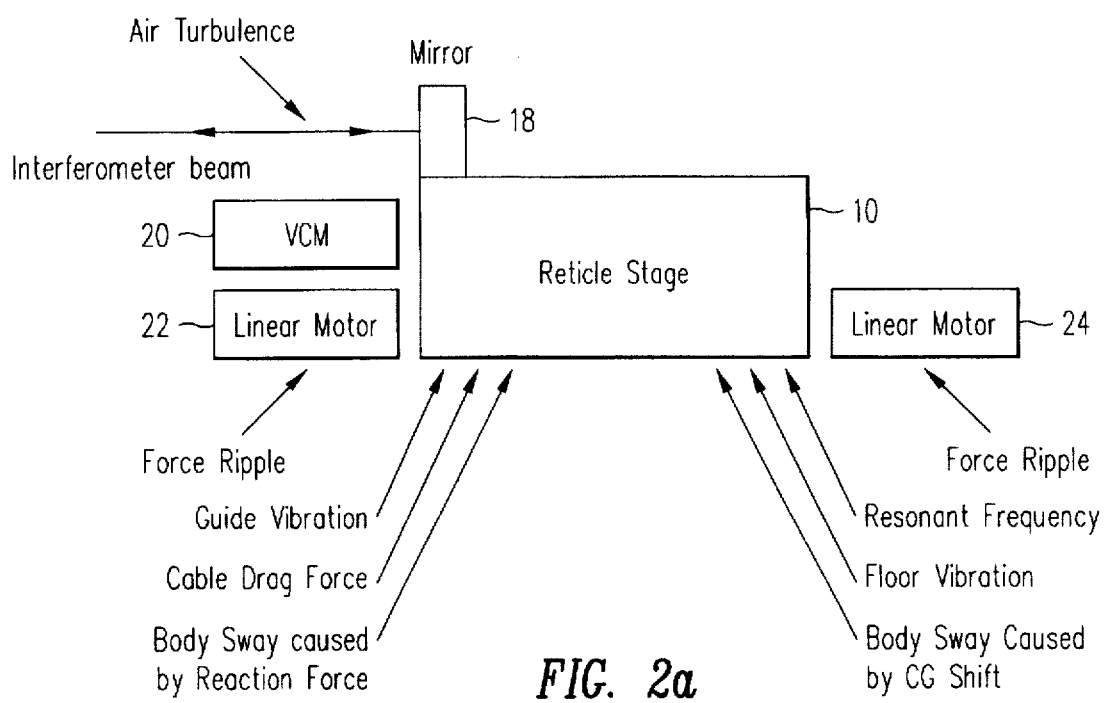
FIG. 2a shows sources of mechanical/environmental disturbances which cause position error during motion of a reticle stage.
Figure 2C:
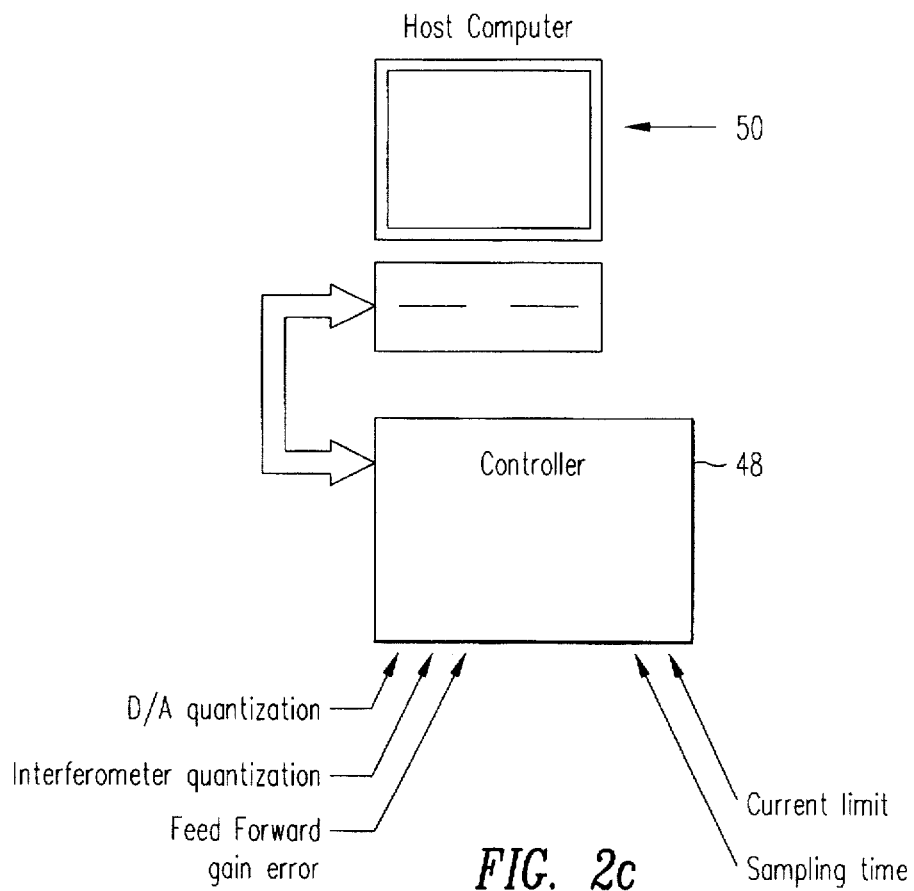
FIG. 2c shows sources of electrical/electronic disturbances which cause position errors during motion of both reticle and wafer stages.
Figure 2B:
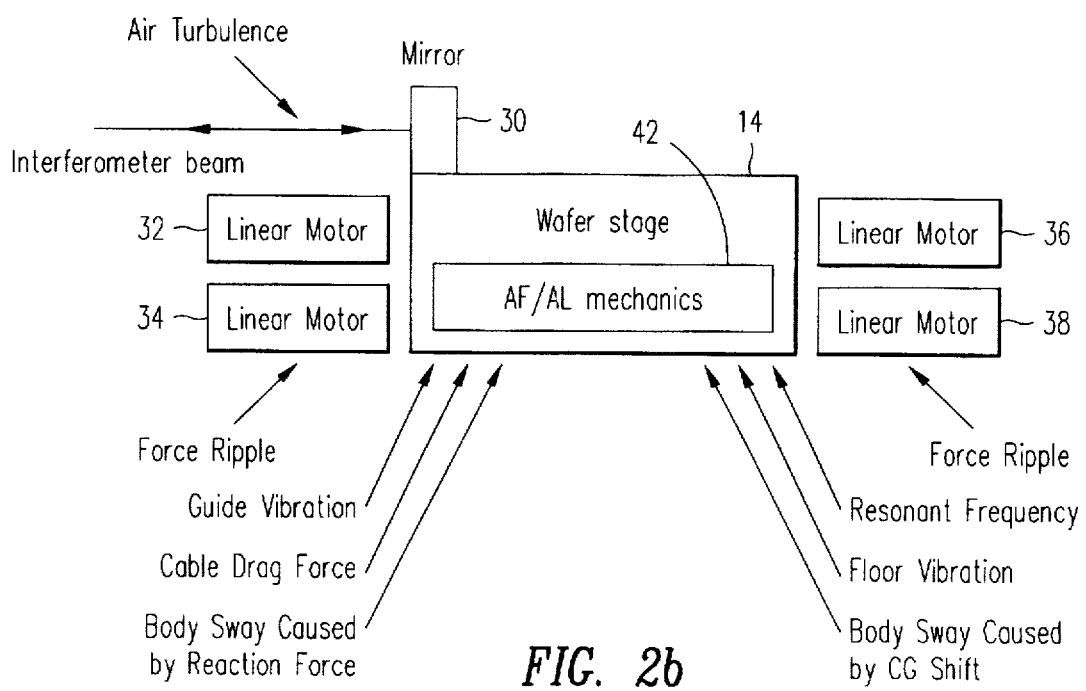
FIG. 2b shows sources of mechanical/environmental disturbances which cause position error during motion of a wafer stage.
Figure 2D:
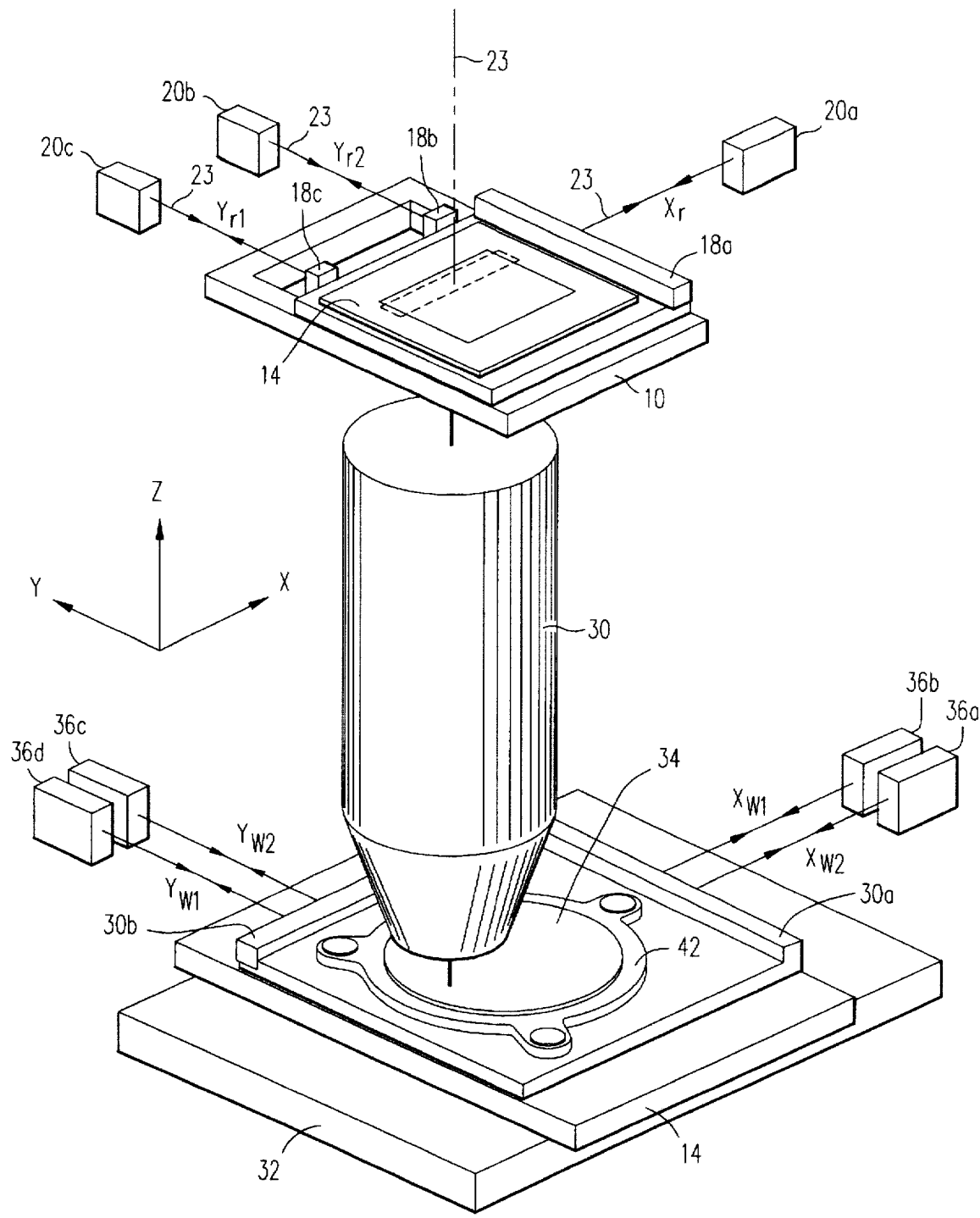
FIG. 2d shows a conventional scanning exposure device for semiconductor lithography.
Figure 3:
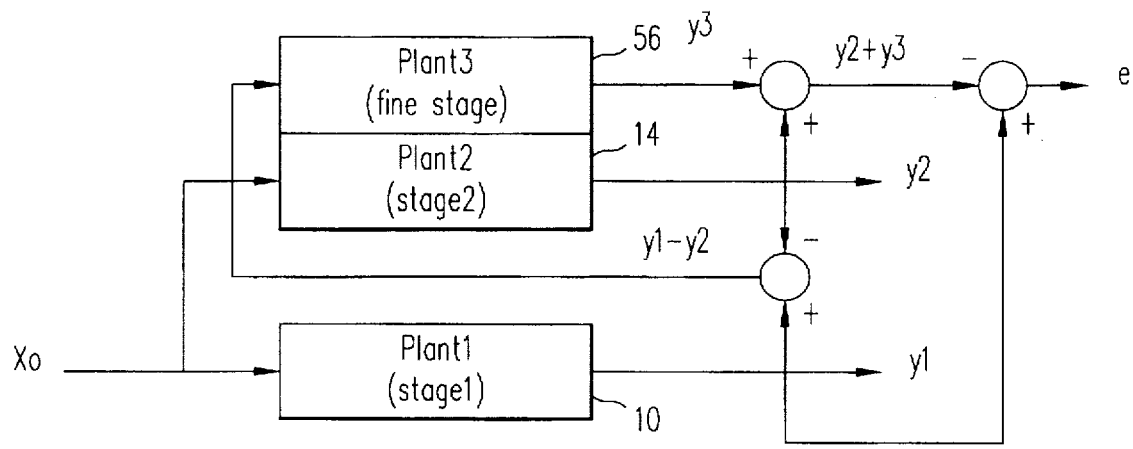
FIG. 3 shows in the prior art the addition of a Fine Motion Mechanism (Plant3) to the arrangement of FIG. 1.
Figure 8:
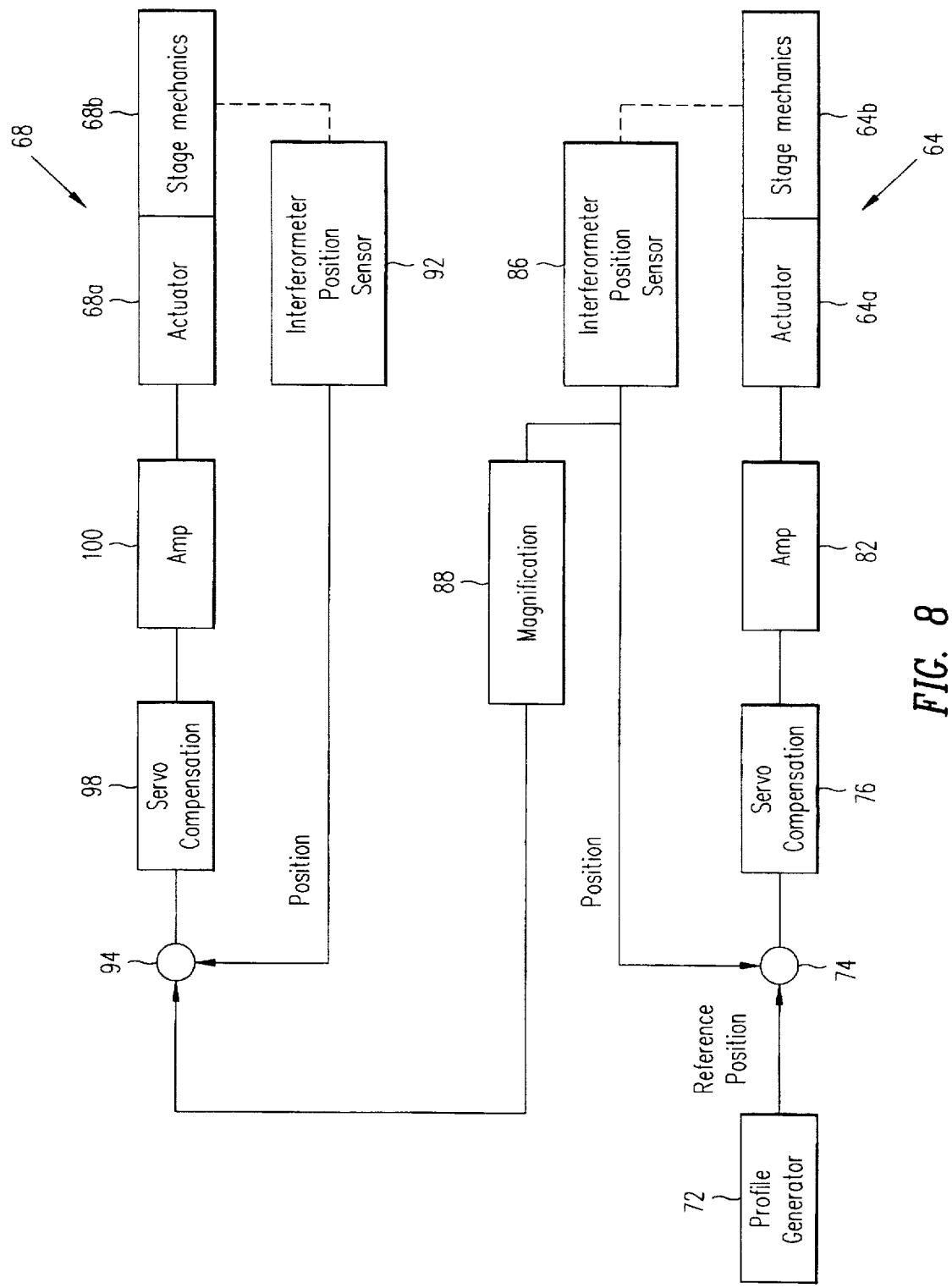
FIG. 8 shows one embodiment of a serial coupling of two stages in accordance with this invention, in additional detail.

FIG. 8 shows in one embodiment a detailed implementation of the structure in accordance with this invention also depicted in FIG. 4. Shown in FIG. 8 are stage1 64 which includes two elements, which are the actuator, e.g. a voice coil motor or linear motor or stepper motor, which drives the stage mechanics 64b. Stage mechanics 64b is the portion of the stage 64 which moves. Stage 64 is for instance the reticle stage or wafer stage in the system depicted in FIG. 2d. (Actuator 64a is not depicted in FIG. 2d.) A conventional profile generator 72 outputs a signal indicative of the desired reference position of stage 64. This signal is coupled to an adder 74. The output signal from adder 74 in turn drives a servo compensation circuit 76 which outputs a corrected drive signal.

The output signal from the servo compensation circuit 76 is coupled to a conventional motor drive amplifier 82 which in turn provides the amplified signal which actually drives the actuator 64a. When the stage 64 is moving, or after it has settled down to a new position, its position is detected by position sensor 86. Position sensor 86 is e.g. the interferometer of FIG. 2d or any other type of sensor, as described above, such as a capacitive or magnetic sensor, or a linear encoder. Position sensor 86 therefor outputs a position signal indicative of the position of stage 64. This signal is coupled both to the adder 74 and to a magnification circuit 88 which corresponds to the multiply by four or multiply by 0.25 circuits shown in FIGS. 5a, 5b, respectively. Magnification circuit 88 is required only when the two stages 64 and 68 are not intended to move by the same amounts. The magnification circuit 88 outputs a magnified position signal to a second adder 94.

The second adder 94 outputs a signal to a second servo compensation circuit 98 the output signal of which in turn is coupled to the second motor drive amplifier 100 which in turn provides the drive signal to the actuator 68a associated with the second set of stage mechanics 68b. The actuator 68a and stage mechanics 68b together make up the second stage 68. The position of stage 68 is detected by a second (interferometer) position sensor 92, which outputs its position signal to the second input terminal of adder 94. It is to be understood that the embodiment of FIG. 8 is exemplary and not limiting; various of the elements depicted therein may be omitted in certain embodiments; for instance, there may be no need for any one of servo compensation, magnification, or motor drive amplification in certain embodiments.

This disclosure is illustrative and not limiting; further modifications will be apparent to one skilled in the art and are intended to fall within the scope of the appended claims.

I claim:

1. A method for controlling movement of a first and a second stage, where the stages are to be driven synchronously, comprising the steps of:

providing a driving position signal to a control input terminal of the first stage;

determining a position of the first stage; and coupling a signal indicating the determined position of the first stage as a driving position signal to a control input terminal of the second stage, whereby a position error between the first and second stages is minimized.

2. The method of claim 1, wherein the first and second stages differ in bandwidth, and further comprising the step of selecting a one of the first and second stages having a higher bandwidth as the second stage.

3. The method of claim 1, further comprising the step of multiplying the determined output position signal by a scale factor before the step of coupling the signal to the second stage.

4. The method of claim 1, wherein the determined position signal y of the first stage is related to the driving position signal u of the second stage by:

$$y=G/(1+G)*u,$$

G being a transfer function.

5. A positioning apparatus comprising:

a first stage; and a second stage, the second stage to be driven synchronously with the first stage;

a source of a driving position signal to the first stage;

a sensor for determining a position of the first stage; and a circuit for coupling a signal representative of the determined position of the first stage as a driving position signal to the second stage, thereby minimizing a position error between the first and second stages.

6. The apparatus of claim 5, wherein the second stage has a higher bandwidth than does the first stage.

7. The apparatus of claim 5 wherein the circuit for coupling a signal representative of the position of the first stage includes a circuit for multiplying the signal representative of the position of the first stage by a scale factor.

8. The apparatus of claim 5, wherein the signal y representative of a position of the first stage is related to the driving position signal u of the second stage by:

$$y = G/(1+G)*u,$$

G being a transfer function.

9. A dual stage positioning apparatus comprising:
- a first stage driven by a positioning signal;
- a second stage serially coupled to the first stage, to be driven synchronously with the first stage; and
- a position sensor located to sense a position of the first stage, wherein the second stage is driven at least in part by an output signal from the position sensor.

* * * * *